United States Patent
Harada

(10) Patent No.: US 12,439,644 B2
(45) Date of Patent: Oct. 7, 2025

(54) PILLAR-SHAPED SEMICONDUCTOR DEVICE AND METHOD FOR MANUFACTURING THE SAME

(71) Applicant: Unisantis Electronics Singapore Pte. Ltd., Singapore (SG)

(72) Inventor: Nozomu Harada, Tokyo (JP)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 391 days.

(21) Appl. No.: 18/309,002

(22) Filed: Apr. 28, 2023

(65) Prior Publication Data
US 2023/0268413 A1 Aug. 24, 2023

Related U.S. Application Data

(63) Continuation of application No. PCT/JP2020/040575, filed on Oct. 29, 2020.

(51) Int. Cl.
H10D 30/67 (2025.01)
H10D 30/01 (2025.01)
(Continued)

(52) U.S. Cl.
CPC ....... H10D 30/6735 (2025.01); H10D 30/014 (2025.01); H10D 30/43 (2025.01);
(Continued)

(58) Field of Classification Search
CPC ................ H10D 30/01; H10D 30/014; H10D 30/019–0198; H10D 30/021;
(Continued)

(56) References Cited

U.S. PATENT DOCUMENTS

2010/0207199 A1* 8/2010 Masuoka ........... H10D 30/6728
257/329
2015/0325444 A1 11/2015 Masuoka et al.
(Continued)

FOREIGN PATENT DOCUMENTS

JP H 02-188966 A 7/1990
JP WO 2014/184933 A1 11/2014
(Continued)

OTHER PUBLICATIONS

Notification of Transmittal of Translation of the International Preliminary Report on Patentability in PCT/JP2020/040575, dated May 11, 2023 (5 pages).
(Continued)

*Primary Examiner* — Cheung Lee
(74) *Attorney, Agent, or Firm* — Crowell & Moring LLP

(57) ABSTRACT

On a semiconductor base that extends in a band shape in a direction (first direction) perpendicular to a line X-X' direction (second direction) in plan view, an $N^+$ layer, a $P^+$ layer, and Si pillars that also extend in a band shape in the first direction are formed. Subsequently, a gate insulating layer and gate conductor layers are formed so as to surround the Si pillars. Subsequently, a contact hole whose bottom portion is in contact with the $N^+$ layer and the $P^+$ layer is formed in an insulating layer, and a first conductor W layer is formed at the bottom portion of the contact hole. Subsequently, an insulating layer that has a hole is formed in the contact hole. Subsequently, a second conductor W layer is formed in the line X-X' direction so as to be connected to the gate conductor layers.

16 Claims, 15 Drawing Sheets

(51) Int. Cl.
*H10D 30/43* (2025.01)
*H10D 62/10* (2025.01)
*H10D 84/01* (2025.01)
*H10D 84/03* (2025.01)
*H10D 84/83* (2025.01)

(52) U.S. Cl.
CPC ....... *H10D 30/6757* (2025.01); *H10D 62/121* (2025.01); *H10D 84/0128* (2025.01); *H10D 84/038* (2025.01); *H10D 84/83* (2025.01)

(58) Field of Classification Search
CPC ................. H10D 30/43; H10D 30/435; H10D 30/501–509; H10D 30/60; H10D 30/6704; H10D 30/6728; H10D 30/6735; H10D 30/674; H10D 30/6757; H10D 62/121; H10D 84/01; H10D 84/0128; H10D 84/0186; H10D 84/0193; H10D 84/0195; H10D 84/038; H10D 84/83; H10D 84/8311; H10D 84/8312; H10D 84/83125; H10D 84/83135; H10D 84/83138; H10D 84/8314; H10D 84/8316; H10D 84/832–833; H10D 84/835; H10D 84/836; H10D 84/837–839; H10D 84/85; H10D 84/851–852

See application file for complete search history.

(56) References Cited

U.S. PATENT DOCUMENTS

| | | |
|---|---|---|
| 2018/0261695 A1 | 9/2018 | Masuoka et al. |
| 2019/0148387 A1 | 5/2019 | Masuoka et al. |
| 2019/0181244 A1 | 6/2019 | Masuoka et al. |
| 2021/0242028 A1 | 8/2021 | Masuoka et al. |

FOREIGN PATENT DOCUMENTS

| | | | |
|---|---|---|---|
| JP | WO 2017/104396 A1 | 6/2017 | |
| JP | WO 2018/033981 A1 | 2/2018 | |
| JP | WO 2019/087328 A1 | 9/2019 | |
| JP | WO 2020/070767 A1 | 9/2020 | |

OTHER PUBLICATIONS

Takato, H., et al. "Impact of Surrounding Gate Transistor (SGT) for Ultra-High-Density LSI's" *IEEE Transactions On Electron Devices*, vol. 38, No. 3, pp. 573-578, Mar. 1991 (6 pages).

\* cited by examiner

PILLAR-SHAPED SEMICONDUCTOR DEVICE AND METHOD FOR MANUFACTURING THE SAME

CROSS REFERENCES TO RELATED APPLICATIONS

The present application is a continuation application of PCT/JP2020/040575, filed Oct. 29, 2020, the entire contents of which are incorporated herein by reference.

BACKGROUND OF THE INVENTION

1. Field of the Invention

The present invention relates to a pillar-shaped semiconductor device and a method for manufacturing the semiconductor device.

2. Description of the Related Art

In recent years, three-dimensional-structure transistors have been used for large-scale integration (LSI). Of these, surrounding gate transistors (SGTs), which are pillar-shaped semiconductor elements, have attracted attention as semiconductor elements that provide semiconductor devices with high integration. In addition, there is a need for semiconductor devices including SGTs with higher integration and higher performance.

A typical planar MOS transistor has a channel extending in the horizontal direction along the upper surface of a semiconductor substrate. By contrast, an SGT has a channel extending in a direction perpendicular to the upper surface of a semiconductor substrate (see, for example, Japanese Unexamined Patent Application Publication No. 2-188966 and Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, Vol. 38, No. 3, pp. 573-578 (1991)). Thus, SGTs allow for higher densities of semiconductor devices than planar MOS transistors.

FIG. 4 shows a schematic structural view of an N-channel SGT. A Si pillar 100 (silicon semiconductor pillars are hereinafter referred to as "Si pillars") whose conductivity type is P-type or i-type (intrinsic type) has $N^+$ layers 101a and 101b (semiconductor regions containing donor impurities in high concentrations are hereinafter referred to as "$N^+$ layers") formed in upper and lower portions of the Si pillar 100, one of the $N^+$ layers serving as a source, the other serving as a drain. The portion of the Si pillar 100 between the $N^+$ layers 101a and 101b, which serve as the source and the drain, forms a channel region 102. A gate insulating layer 103 is formed so as to surround the channel region 102. A gate conductor layer 104 is formed so as to surround the gate insulating layer 103. In the SGT, the $N^+$ layers 101a and 101b, which serve as the source and the drain, the channel region 102, the gate insulating layer 103, and the gate conductor layer 104 are formed so as to have a pillar shape as a whole. A circuit chip including SGTs can achieve a smaller chip size than a circuit chip including planar MOS transistors.

In the SGT in FIG. 4, the $N^+$ layers 101a and 101b, which serve as the source and the drain, and the gate conductor layer 104 are connected to an SGT circuit formed on the same substrate through a source connecting line SL, a drain connecting line DL, and a gate connecting line GL, respectively. In this case, a decrease in coupling capacitance between the source connecting line SL, the drain connecting line DL, and the gate connecting line GL leads to an increase in performance of the circuit including the SGT.

SUMMARY OF THE INVENTION

To form an SGT circuit with higher performance and higher integration, reduction in parasitic capacitance between electrodes of each SGT has been required.

To solve the above problems, a method for manufacturing a pillar-shaped semiconductor device according to the present invention is a method for manufacturing a pillar-shaped semiconductor device that includes
a first semiconductor pillar standing in a direction perpendicular to a substrate,
a first impurity region disposed at a bottom portion of the first semiconductor pillar,
a second impurity region disposed at a top portion of the first semiconductor pillar, one of the first impurity region and the second impurity region serving as a source, the other serving as a drain, the first semiconductor pillar between the first impurity region and the second impurity region serving as a channel,
a first gate insulating layer surrounding the first semiconductor pillar disposed between the first impurity region and the second impurity region, and
a first gate conductor layer surrounding the first gate insulating layer, the method including:
a step of forming the first impurity region such that the first impurity region extends in a band shape in a first direction in plan view;
a step of forming the first semiconductor pillar that overlaps the first impurity region in plan view;
a step of forming a semiconductor base that includes the first semiconductor pillar and the first impurity region and extends in a band shape in the first direction in plan view such that the semiconductor base connects to the bottom portion of the first semiconductor pillar;
a step of forming the first gate insulating layer and the first gate conductor layer such that the first semiconductor pillar is surrounded;
a step of forming a first insulating layer disposed at an outer peripheral portion of the first gate conductor layer;
a step of forming, in the first insulating layer, a contact hole that overlaps the first impurity region disposed in the semiconductor base in plan view, has a bottom portion in contact with the first impurity region, and extends in a band shape in the first direction;
a step of forming, at the bottom portion of the contact hole, a first conductor layer that is in contact with the first impurity region and extends in a band shape in the first direction;
a step of forming, in the contact hole on the first conductor layer, a second insulating layer that has a hole or is made of a low-dielectric-constant material;
a step of lowering an upper surface of the second insulating layer below an upper end of the first gate conductor layer; and
a step of forming a second conductor layer that is in contact with the first gate conductor layer and extends in a band shape in a second direction perpendicular to the first direction in plan view.

The method for manufacturing a pillar-shaped semiconductor device according to the present invention further includes:

a step of forming the first semiconductor pillar using a first mask material layer as an etching mask;

a step of forming a third insulating layer that surrounds the first semiconductor pillar and has an upper surface located at a bottom portion of the first mask material layer or the top portion of the first semiconductor pillar in the direction perpendicular to the substrate;

a step of forming a second mask material layer that is disposed on the third insulating layer and surrounds the exposed first mask material layer and the top portion of the first semiconductor pillar with an equal width in plan view;

a step of forming, on the third insulating layer, a third mask material layer that partially overlaps the second mask material layer and extends in a band shape in the first direction in plan view; and a step of forming the semiconductor base by etching the third insulating layer and the first impurity layer using the first mask material layer, the second mask material layer, and the third mask material layer as masks.

Furthermore, in the method for manufacturing a pillar-shaped semiconductor device according to the present invention, in the first direction in plan view, the second conductor layer is formed so as to have a width that is smaller than a longest line segment among point-to-point distances between intersections of an outer peripheral line of the first gate conductor layer and straight lines extending in the first direction.

Furthermore, in the method for manufacturing a pillar-shaped semiconductor device according to the present invention, in the direction perpendicular to the substrate, the first conductor layer is formed so as to have an upper end that is located below a lower end of the first gate conductor layer.

Furthermore, in the method for manufacturing a pillar-shaped semiconductor device according to the present invention, in the direction perpendicular to the substrate, the hole is formed so as to have an upper end that is located below an upper end of the first gate conductor layer.

The method for manufacturing a pillar-shaped semiconductor device according to the present invention further includes:

a step of forming a second semiconductor pillar on the semiconductor base on an opposite side of the first conductor layer from the first semiconductor pillar in the second direction in plan view;

a step of forming a second gate insulating layer such that the second gate insulating layer surrounds the second semiconductor pillar;

a step of forming a second gate conductor layer such that the second gate conductor layer surrounds the second gate insulating layer; and a step of forming the second conductor layer that extends in the second direction in plan view and is connected to an upper end portion of the second gate conductor layer.

The method for manufacturing a pillar-shaped semiconductor device according to the present invention further includes:

a step of forming a third impurity region that is disposed in the semiconductor base and is adjacent to the first impurity region in the first direction in plan view;

a step of forming a third semiconductor pillar on the third impurity region;

a step of forming a third gate insulating layer such that the third gate insulating layer surrounds the third semiconductor pillar;

a step of forming a third gate conductor layer such that the third gate conductor layer surrounds the third gate insulating layer;

a step of forming the second conductor layer such that the second conductor layer extends in the first direction and is in contact with the third impurity region in plan view; and a step of forming a third conductor layer that extends in the second direction in plan view and connects to upper portions of the first gate conductor layer and the third gate conductor layer.

The method for manufacturing a pillar-shaped semiconductor device according to the present invention further includes:

a step of forming, on the substrate, a first impurity layer on which the first impurity region is based;

a step of forming, on the first impurity layer, a first semiconductor layer on which the first semiconductor pillar is partially based; and a step of forming, on the first semiconductor layer, a second impurity layer on which the first semiconductor pillar is partially based and which forms at least a part of the second impurity region.

The method for manufacturing a pillar-shaped semiconductor device according to the present invention further includes a step of forming, on the second impurity region, a third impurity layer having the same polarity as that of the second impurity region or a conductive layer made of an alloy or a metal.

To solve the problems described above, a pillar-shaped semiconductor device according to the present invention includes:

a first semiconductor pillar standing perpendicularly with respect to a substrate;

a first impurity region connecting to a bottom portion of the first semiconductor pillar and extending in a band shape in a first direction;

a second impurity region disposed at a top portion of the first semiconductor pillar;

a first gate insulating layer surrounding the first semiconductor pillar disposed between the first impurity region and the second impurity region;

a first gate conductor layer surrounding the first gate insulating layer;

a semiconductor base connecting to the bottom portion of the first semiconductor pillar, including the first impurity region, and extending in a band shape in the first direction in plan view;

a first insulating layer disposed at an outer peripheral portion of the first gate conductor layer;

a first material layer disposed in the first insulating layer, overlapping the first impurity region disposed in the semiconductor base in plan view, having a bottom portion in contact with the first impurity region, and extending in a band shape in the first direction and also extending in a vertical direction;

a first conductor layer extending in a band shape in the first direction so as to be in contact with the first impurity region at a bottom portion of the first material layer;

a second insulating layer in which the first material layer on the first conductor layer has a hole whose upper surface is located below an upper end of the first gate conductor layer or which is made of a low-dielectric-constant material; and a second conductor layer connecting to the first gate conductor layer and extending in a band shape in a second direction perpendicular to the first direction in plan view, wherein the first conductor layer and the second conductor layer overlap each other at an intersection in plan view.

Furthermore, in the pillar-shaped semiconductor device according to the present invention, the second conductor layer connects to the gate conductor layer in a contact manner, and in the first direction in plan view, the second conductor layer is formed so as to have a width that is smaller than a longest line segment among point-to-point distances between intersections of an outer peripheral line of the first gate conductor layer and straight lines extending in the first direction.

Furthermore, in the pillar-shaped semiconductor device according to the present invention, in a direction perpendicular to the substrate, an upper end of the first conductor layer is located below a lower end of the first gate conductor layer.

The pillar-shaped semiconductor device according to the present invention further includes:

a second semiconductor pillar disposed on the semiconductor base on an opposite side of the first conductor layer from the first semiconductor pillar in the second direction in plan view;

a second gate insulating layer surrounding the second semiconductor pillar;

a second gate conductor layer surrounding the second gate insulating layer; and the second conductor layer extending in the second direction in plan view and connected to an upper end portion of the second gate conductor layer.

The pillar-shaped semiconductor device according to the present invention further includes:

a third impurity region disposed in the semiconductor base and adjacent to the first impurity region in the first direction in plan view;

a third semiconductor pillar disposed on the third impurity region;

a third gate insulating layer surrounding the third semiconductor pillar; and a third gate conductor layer surrounding the third gate insulating layer, wherein the first conductor layer extends in the first direction and is adjacent to the third semiconductor pillar in plan view, and the pillar-shaped semiconductor device further includes a third conductor layer extending in the second direction in plan view and connecting to upper portions of the first gate conductor layer and the third gate conductor layer.

The pillar-shaped semiconductor device according to the present invention further includes:

a second insulating layer on the third conductor layer;

a first contact hole disposed in the second insulating layer on the third conductor layer; and the second conductor layer disposed on the second insulating layer and connecting to the third conductor layer through the first contact hole.

The pillar-shaped semiconductor device according to the present invention further includes, on the second impurity region, a third impurity layer having the same polarity as that of the second impurity region or a conductive layer made of an alloy or a metal.

BRIEF DESCRIPTION OF THE DRAWINGS

FIGS. 1IA and 1IB are respectively a plan view and a sectional structural view that illustrate the method for manufacturing an SGT-including pillar-shaped semiconductor device according to the first embodiment.

DESCRIPTION OF THE PREFERRED EMBODIMENTS

Hereinafter, a method for manufacturing a pillar-shaped semiconductor device according to the present invention will be described with reference to the drawings.

First Embodiment

Hereinafter, a method for manufacturing a DRAM circuit according to a first embodiment of the present invention will be described with reference to FIG. 1AA to FIG. 1LB. Among these figures, figures with the suffix A are plan views, and figures with the suffix B are sectional structural views taken along a line X-X' direction (an example of the "second direction" in the claims, hereinafter the same) in the figures with the suffix A.

Figure 1A:
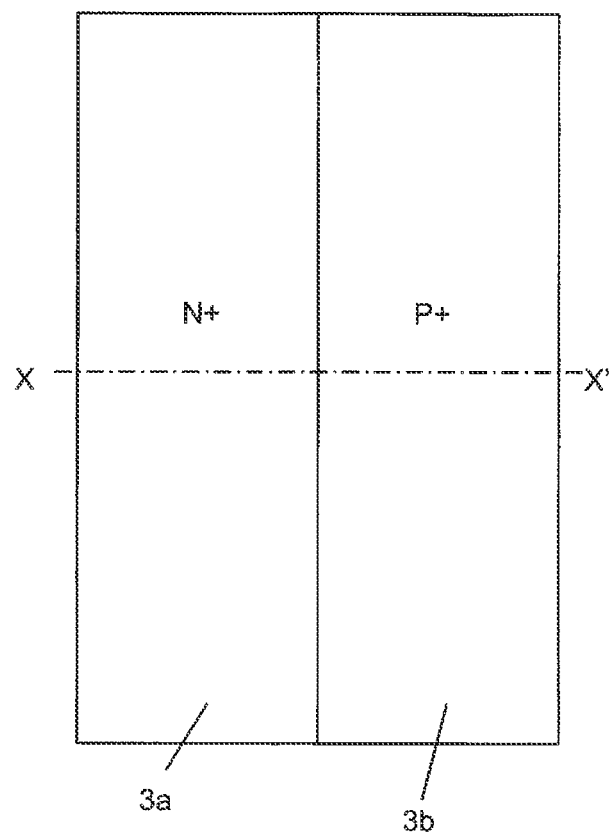
FIGS. 1AA and 1AB are respectively a plan view and a sectional structural view that illustrate a method for manufacturing an SGT-including pillar-shaped semiconductor device according to a first embodiment.
Figure 1A:
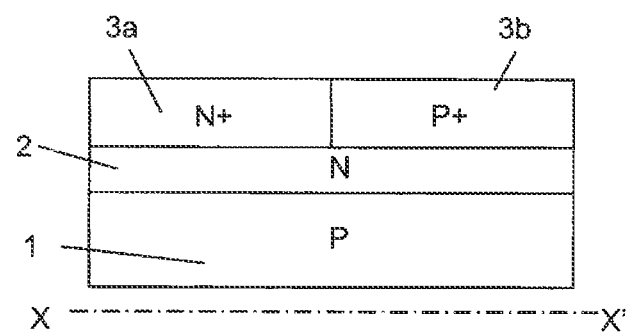

As illustrated in FIGS. 1AA and 1AB, an N layer 2 is formed on a P layer substrate 1 (an example of the "substrate" in the claims). Subsequently, an $N^+$ layer 3a and a $P^+$ layer 3b extending in a band shape in a direction (an example of the "first direction" in the claims, hereinafter the same) perpendicular to the line X-X' direction in plan view are formed on the N layer 2.

Figure 1B:
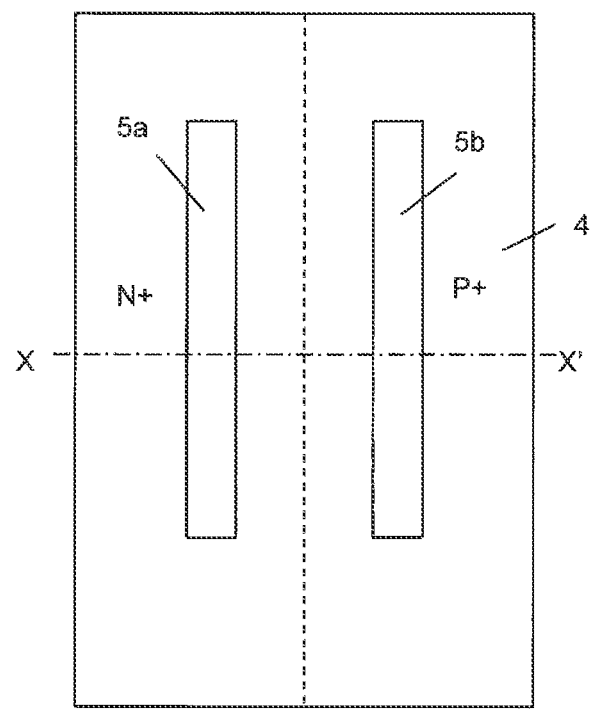
FIGS. 1BA and 1BB are respectively a plan view and a sectional structural view that illustrate the method for manufacturing an SGT-including pillar-shaped semiconductor device according to the first embodiment.
Figure 1B:
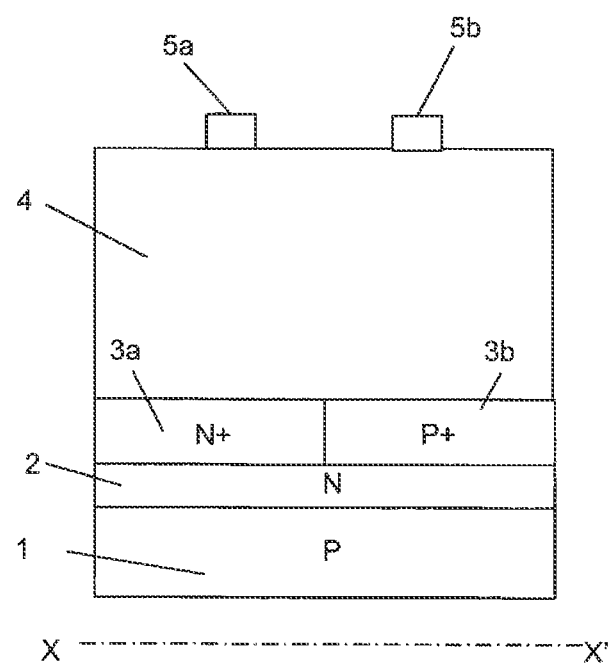

Next, as illustrated in FIGS. 1BA and 1BB, a P layer 4 is formed by epitaxial growth. Subsequently, mask material layers 5a and 5b (examples of the "first mask material layer" in the claims) that are rectangular in plan view are formed on the P layer 4 so as to overlie the $N^+$ layer 3a and the $P^+$ layer 3b, respectively, in plan view.

Figure 1C:
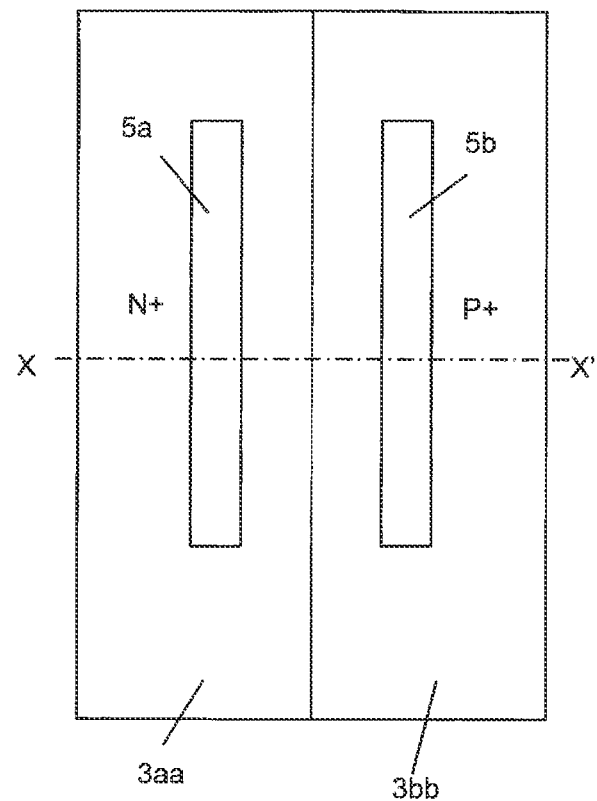
FIGS. 1CA and 1CB are respectively a plan view and a sectional structural view that illustrate the method for manufacturing an SGT-including pillar-shaped semiconductor device according to the first embodiment.
Figure 1C:
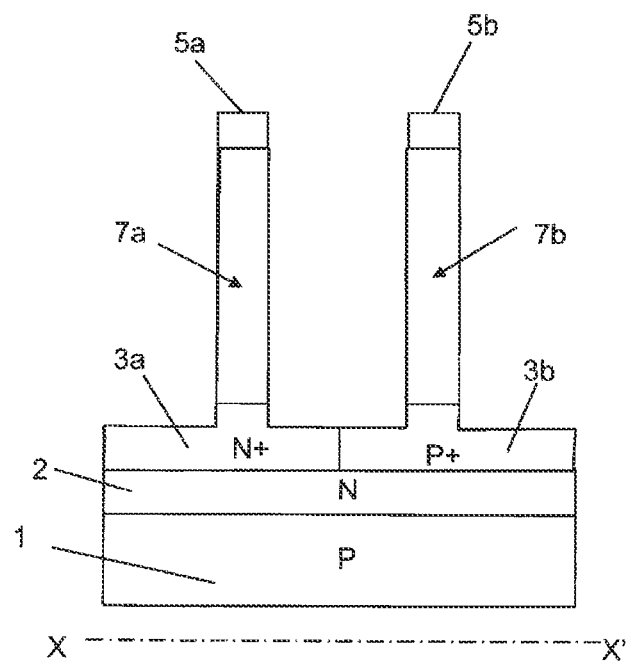

Next, as illustrated in FIGS. 1CA and 1CB, the P layer 4 and upper portions of the $N^+$ layer 3a and the $P^+$ layer 3b are etched using the mask material layers 5a and 5b as masks, thereby forming a Si pillar 7a and a Si pillar 7b (examples of the "semiconductor pillar" in the claims) on the $N^+$ layer 3a and the $P^+$ layer 3b, respectively.

Figure 1D:
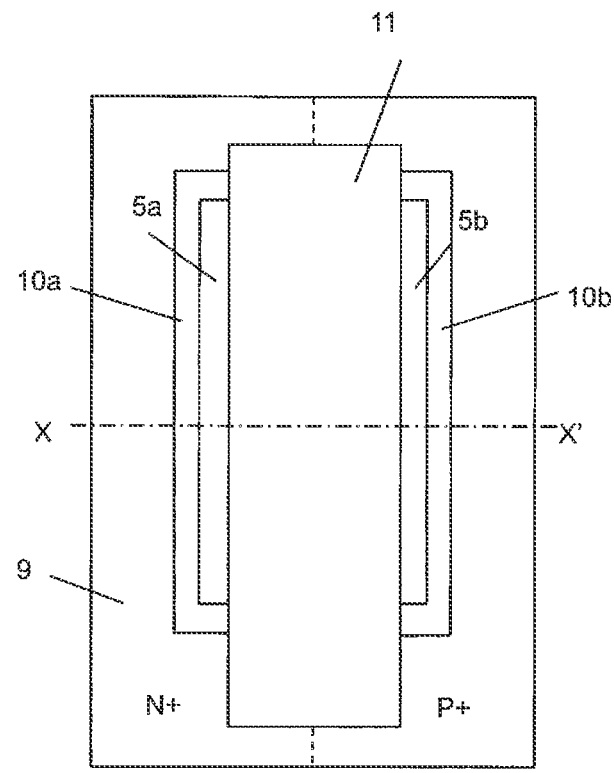
FIGS. 1DA and 1DB are respectively a plan view and a sectional structural view that illustrate the method for manufacturing an SGT-including pillar-shaped semiconductor device according to the first embodiment.
Figure 1D:
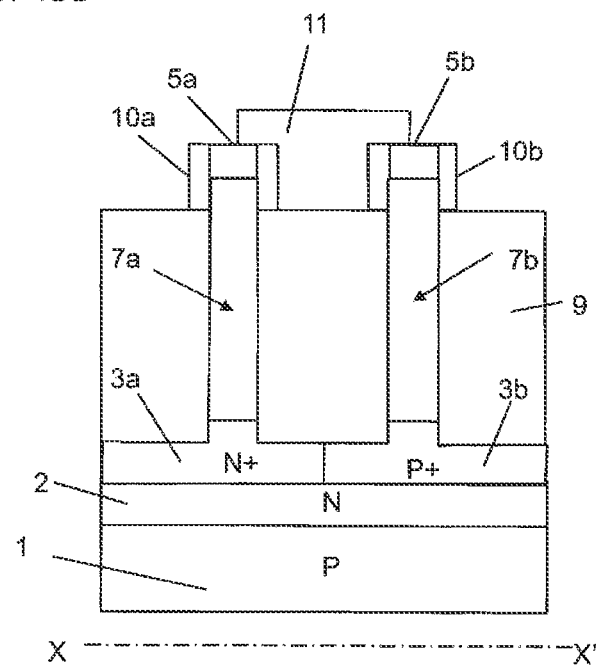

Next, as illustrated in FIGS. 1DA and 1DB, a silicon nitride (SiN) layer 9 (an example of the "third insulating layer" in the claims) is formed at outer peripheries of the Si pillars 7a and 7b such that the upper surface of the SiN layer 9 is located at top portions of the Si pillars 7a and 7b. Subsequently, silicon oxide ($SiO_2$) layers 10a and 10b (examples of the "second mask material layer" in the claims) surrounding the top portions of the Si pillars 7a and 7b and the side surfaces of the mask material layers 5a and 5b, respectively, with an equal width in plan view are formed. Subsequently, a mask material layer 11 (an example of the "third mask material layer" in the claims) partially overlapping the mask material layers 5a and 5b and the $SiO_2$ layers 10a and 10b and extending in a band shape in a direction perpendicular to the line X-X' direction in plan view is formed. The $SiO_2$ layers 10a and 10b may be formed in such a manner that the mask material layers 5a and 5b are covered with $SiO_2$ layers (not illustrated), and the $SiO_2$ layers are then etched by, for example, reactive ion etching (RIE). Thus, the $SiO_2$ layers 10a and 10b are formed around the mask material layers 5a and 5b, respectively, with an equal width in plan view. Since the mask material layers 5a and 5b are formed in a self-aligned manner with respect to the Si pillars 7a and 7b, respectively, the $SiO_2$ layers 10a and 10b are formed in a self-aligned manner with respect to the Si pillars 7a and 7b, respectively. The SiN layer 9 may be formed after thin $SiO_2$ layers (not illustrated) are formed on the side surfaces of the Si pillars 7a and 7b.

Figure 1E:
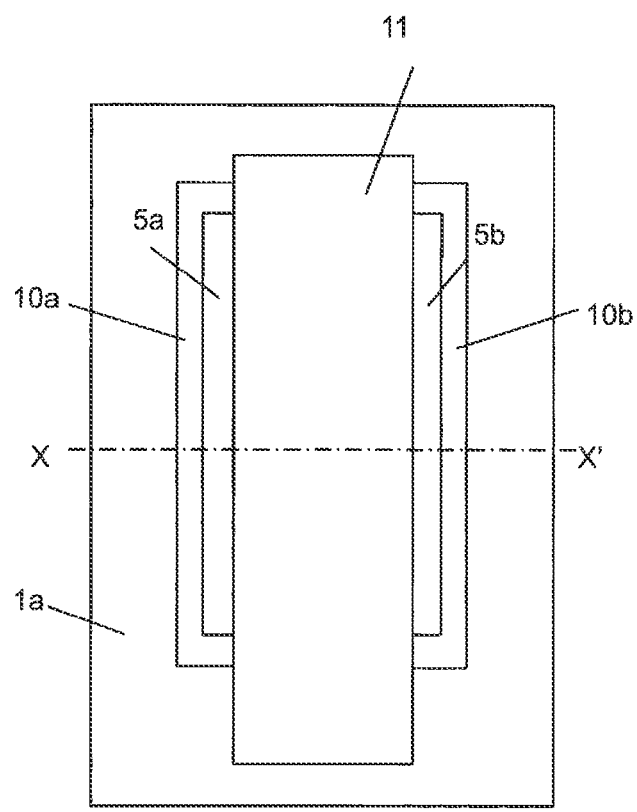
FIGS. 1EA and 1EB are respectively a plan view and a sectional structural view that illustrate the method for manufacturing an SGT-including pillar-shaped semiconductor device according to the first embodiment.
Figure 1E:
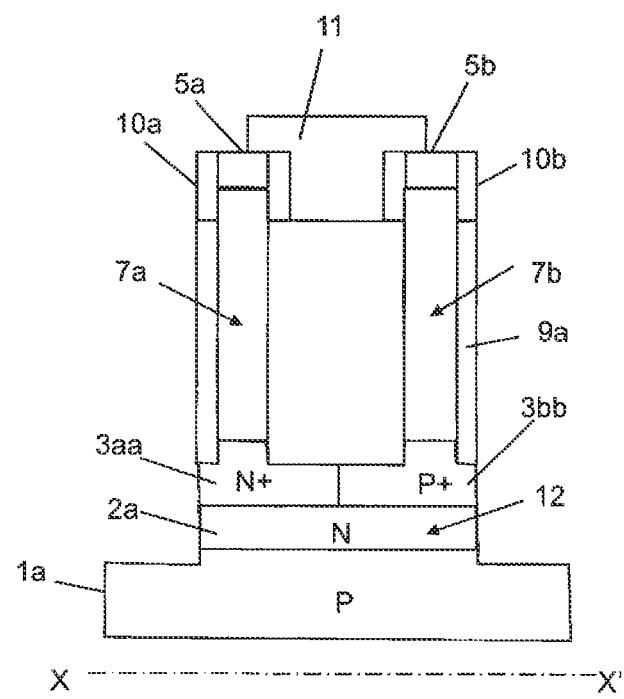

Next, as illustrated in FIGS. 1EA and 1EB, the SiN layer 9, the $N^+$ layer 3a, the $P^+$ layer 3b, the N layer 2, and the P layer substrate 1 are etched using the mask material layers 5a and 5b, the mask material layer 11, and the $SiO_2$ layers 10a and 10b as masks to form a P layer base 12 (an example of the "semiconductor base" in the claims) constituted by an $N^+$ layer 3aa, a $P^+$ layer 3bb, an N layer 2a, and a P layer substrate 1a. In plan view, the P layer base 12 is shaped such that the $N^+$ layer 3aa and the $P^+$ layer 3bb extending in a band shape in the direction perpendicular to the line X-X' direction and outer peripheries of the Si pillars 7a and 7b partially protrude beyond the mask material layer 11. Portions of the P layer base 12 located where the outer peripheries of the Si pillars 7a and 7b partially protrude are formed using the SiN layer 9a formed in a self-aligned manner with the Si pillars 7a and 7b as an etching mask, and thus are formed in a self-aligned manner with the Si pillars 7a and 7b.

Figure 1F:
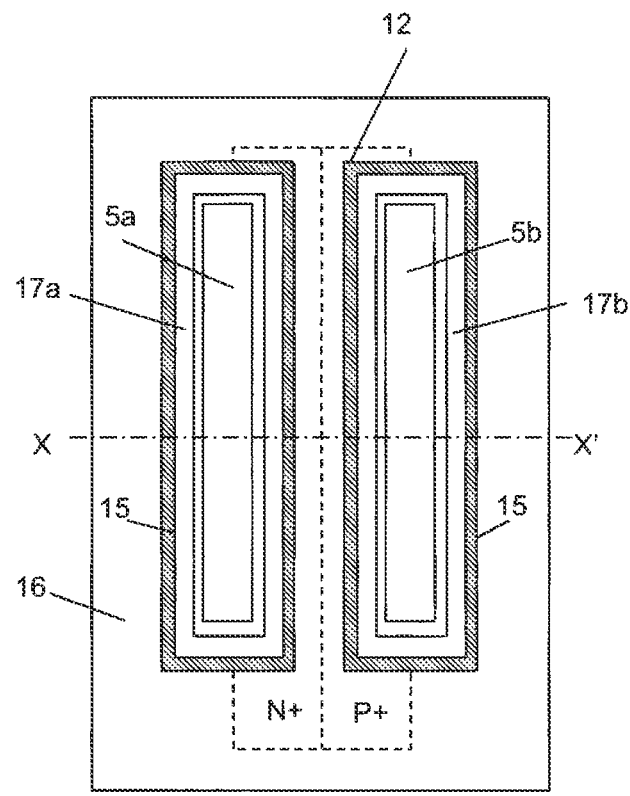
FIGS. 1FA and 1FB are respectively a plan view and a sectional structural view that illustrate the method for manufacturing an SGT-including pillar-shaped semiconductor device according to the first embodiment.
Figure 1F:
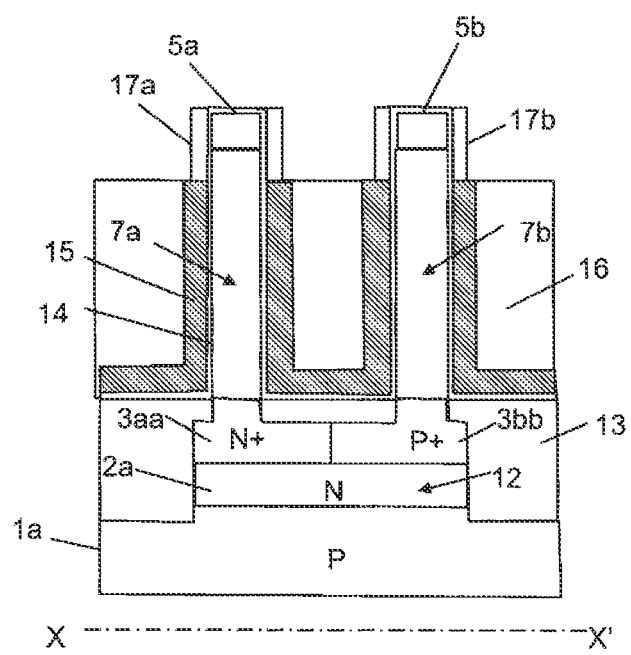

Next, as illustrated in FIGS. 1FA and 1FB, the mask material layer 11, the $SiO_2$ layers 10a and 10b, and the SiN layer 9a are removed. Subsequently, a $SiO_2$ layer 13 is formed so as to surround the P layer base 12 such that the upper surface of the $SiO_2$ layer 13 is located above the upper surface of the P layer base 12. Subsequently, a hafnium oxide ($HfO_2$) layer 14 (an example of the "gate insulating layer" in the claims) serving as a gate insulating layer is formed so as to surround the Si pillars 7a and 7b by, for example, atomic layer deposition (ALD). Subsequently, a TiN layer (not illustrated) serving as a gate conductor layer and a $SiO_2$ layer (not illustrated) are formed so as to cover the $HfO_2$ layer 14. Subsequently, the TiN layer and the $SiO_2$ layer are polished by chemical mechanical polishing (CMP) such that the upper surfaces thereof are flush with the upper surfaces of the mask material layers 5a and 5b. Subsequently, the $SiO_2$ layer and the TiN layer are etched by RIE such that the upper surfaces thereof are located at upper portions of the Si pillars 7a and 7b, thereby forming a TiN layer 15 and a $SiO_2$ layer 16. Subsequently, a SiN layer (not illustrated) is formed so as to cover the entire surface. Subsequently, the SiN layer is etched by RIE to form SiN layers 17a and 17b respectively surrounding the side surfaces of the mask material layers 5a and 5b and the top portions of the Si pillars 7a and 7b with an equal width in plan view. Depending on the RIE etching conditions, the width of the SiN layers 17a and 17b may be unequal in plan view. The SiN layers 17a and 17b are only required to respectively surround the side surfaces of the mask material layers 5a and 5b and the top portions of the Si pillars 7a and 7b.

Figure 1G:
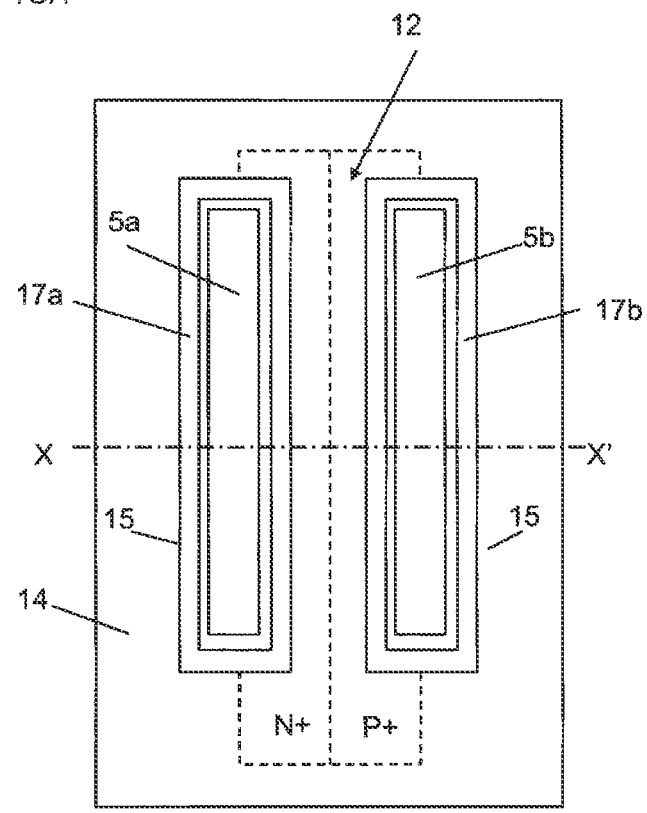
FIGS. 1GA and 1GB are respectively a plan view and a sectional structural view that illustrate the method for manufacturing an SGT-including pillar-shaped semiconductor device according to the first embodiment.
Figure 1G:
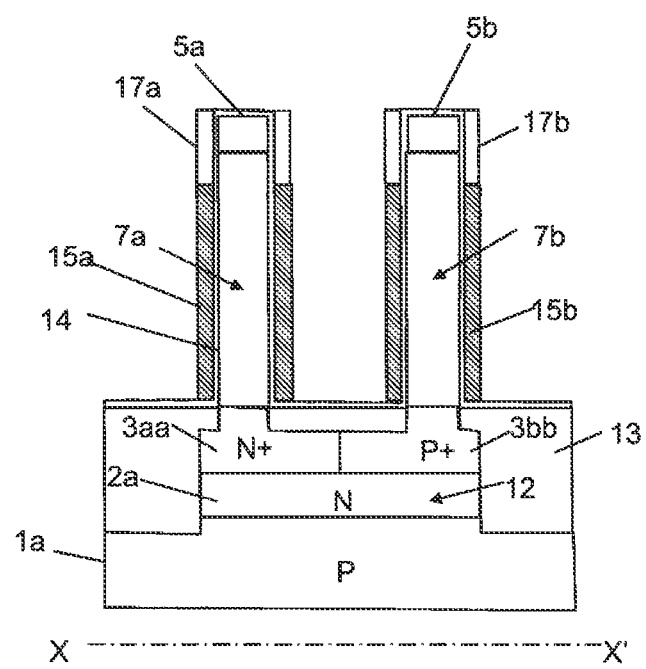

Next, as illustrated in FIGS. 1GA and 1GB, the $SiO_2$ layer 16 is removed. Subsequently, the TiN layer 15 is etched by RIE using the SiN layers 17a and 17b as masks to form TiN layers 15a and 15b (examples of the "gate conductor layer" in the claims) serving as gate conductor layers. In this case, since the SiN layers 17a and 17b serving as etching masks are formed in a self-aligned manner with respect to the Si pillars 7a and 7b, respectively, the TiN layers 15a and 15b are also formed in a self-aligned manner with respect to the Si pillars 7a and 7b, respectively.

Figure 1H:
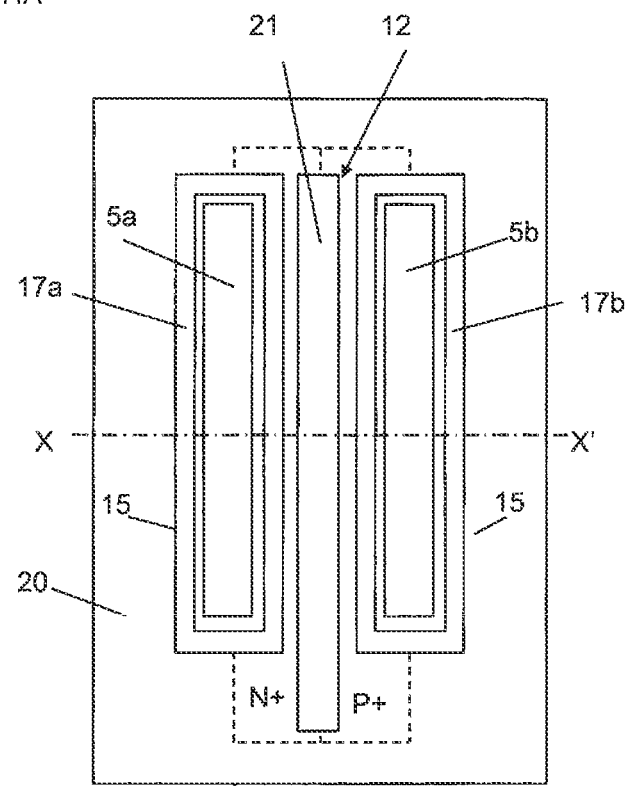
FIGS. 1HA and 1HB are respectively a plan view and a sectional structural view that illustrate the method for manufacturing an SGT-including pillar-shaped semiconductor device according to the first embodiment.
Figure 1H:
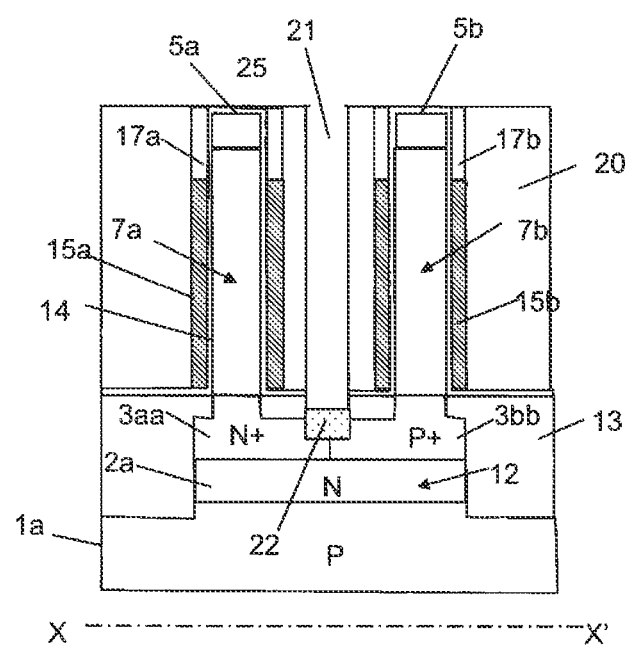
Figure 11A:
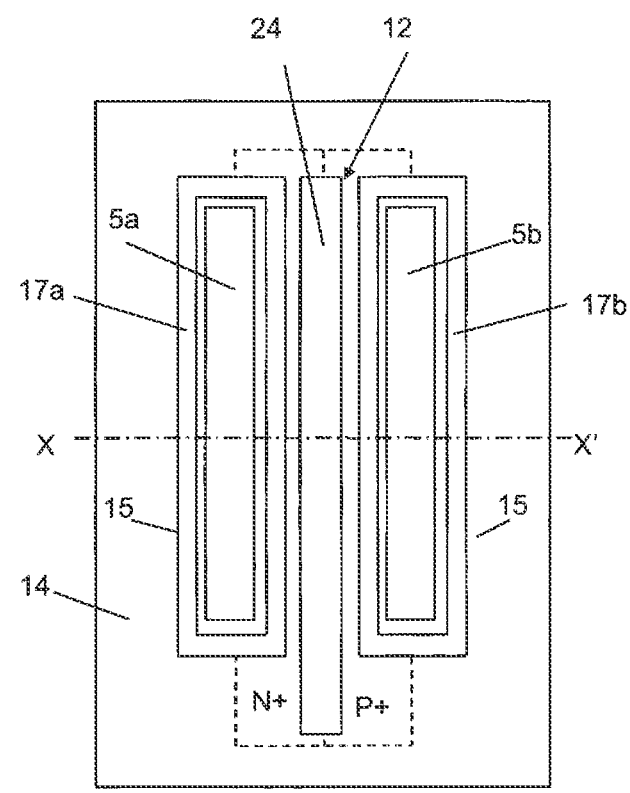
Figure 11B:
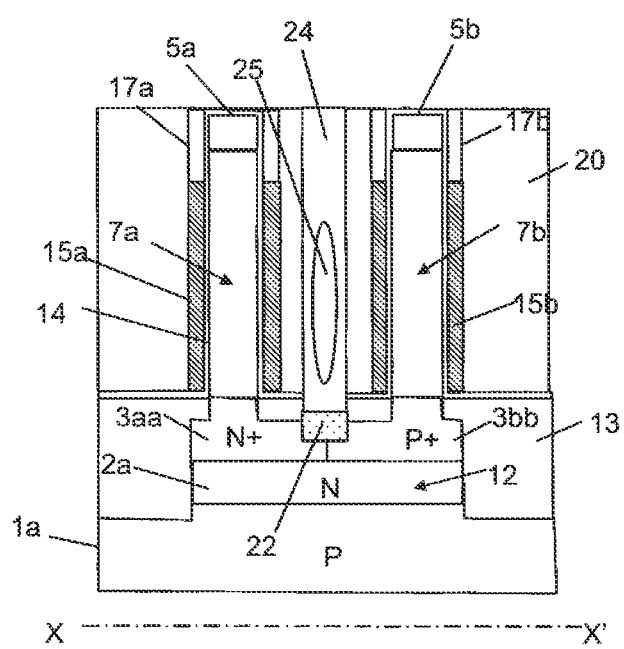

Next, as illustrated in FIGS. 1HA and 1HB, a $SiO_2$ layer (not illustrated) is formed so as to cover the entire surface and polished by CMP such that the upper surface thereof is flush with the upper surfaces of the mask material layers 5a and 5b, thereby forming a $SiO_2$ layer 20. Subsequently, a contact hole 21 (an example of the "contact hole" in the claims) partially overlapping the $N^+$ layer 3aa and the $P^+$ layer 3bb, extending in a band shape in the direction perpendicular to the line X-X' direction in plan view, and having a bottom overlapping the $N^+$ layer 3aa and the $P^+$ layer 3bb is formed. Subsequently, a tungsten (W) layer (not illustrated) is deposited over the entire surface and then polished by CMP such that the upper surface thereof is flush with the upper surfaces of the mask material layers 5a and 5b. Subsequently, the W layer in the contact hole 21 is etched by RIE to form a W layer 22 (an example of the "first conductor layer" in the claims) in contact with the N$^+$ layer 3aa and the P$^+$ layer 3bb at a bottom portion of the contact hole 21. The upper surface of the W layer 22 is located below the lower ends of the TiN layers 15a and 15b. Before the W layer 22 is formed, a buffer metal layer such as a TaN layer for reducing the contact resistance between the W layer 22 and the N$^+$ layer 2aa and between the W layer 22 and the P$^+$ layer 3bb may be formed.

Next, as illustrated in FIGS. 1IA and 1IB, a SiO$_2$ layer 24 (an example of the "second insulating layer" in the claims) having a hole 25 therein is formed in the contact hole 21. The upper end of the hole 25 is located below the upper ends of the TiN layers 15a and 15b. The SiO$_2$ layer 24 may be formed of a low-dielectric-constant material such as silicon oxycarbide (SiOC). In this case, the hole 25 may be, but need not be, formed.

Figure 1J:
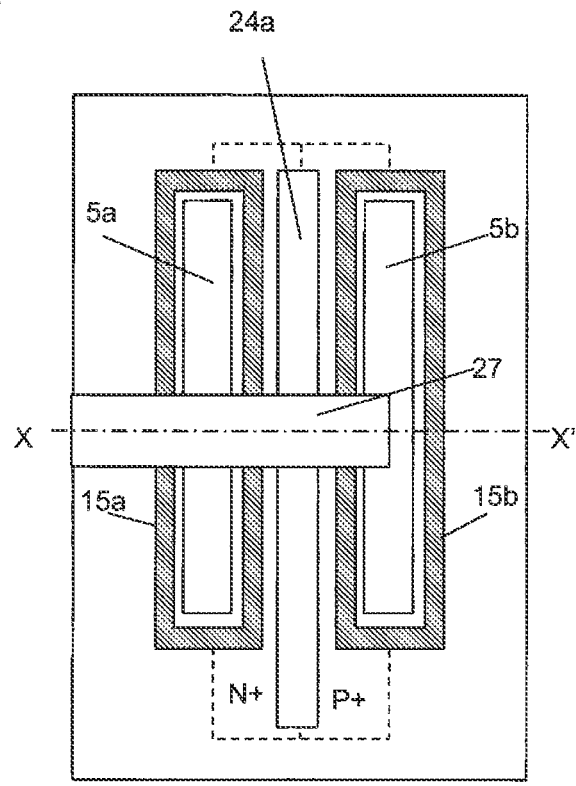
FIGS. 1JA and 1JB are respectively a plan view and a sectional structural view that illustrate the method for manufacturing an SGT-including pillar-shaped semiconductor device according to the first embodiment.
Figure 1J:
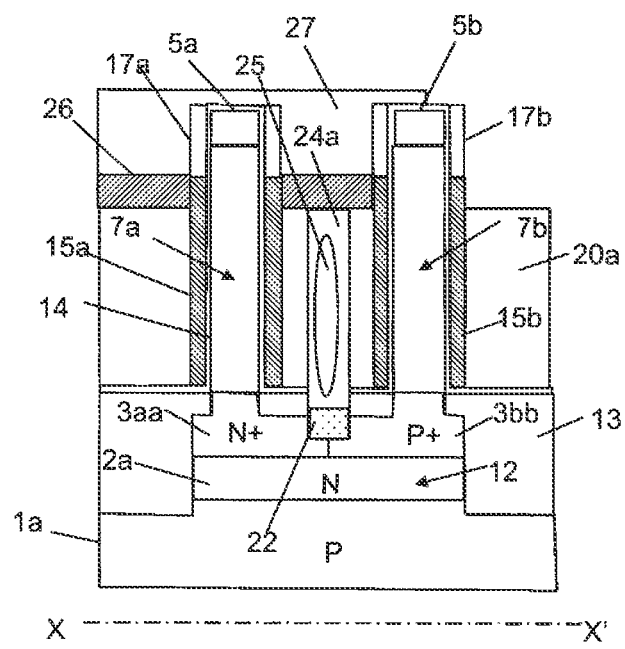

Next, as illustrated in FIGS. 1JA and 1JB, the SiO$_2$ layers 20 and 24 are etched by RIE such that the upper surfaces thereof are located below the upper ends of the TiN layers 15a and 15b to form a SiO$_2$ layer 20a (an example of the "first insulating layer" in the claims) and a SiO$_2$ layer 24a. Subsequently, a W layer (not illustrated) connected to the TiN layers 15a and 15b is formed at outer peripheral portions of the TiN layers 15a and 15b. Subsequently, a mask material layer 27 partially overlapping the TiN layers 15a and 15b and extending in a band shape in the line X-X' direction in plan view is formed. Subsequently, the W layer is etched using the mask material layer 27 as a mask. Thus, a W layer 26 (an example of the "second conductor layer" in the claims) connected to the TiN layers 15a and 15b and extending in the line X-X' direction in plan view is formed. The width of the W layer 26 in the direction perpendicular to the line X-X' direction in plan view is smaller than the lengths of the Si pillars 7a and 7b in the direction perpendicular to the line X-X' direction. Subsequently, the mask material layer 27 is removed.

Figure 1K:
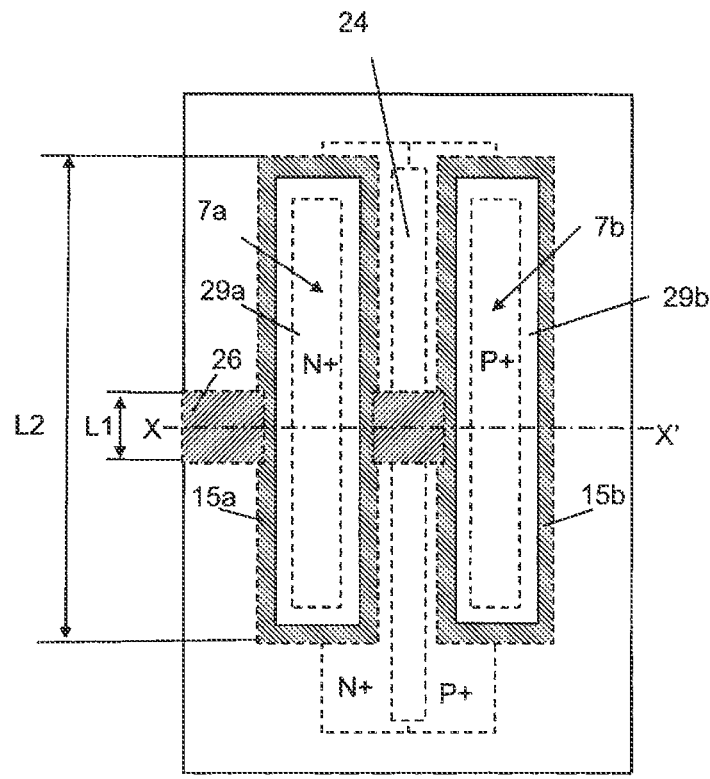
FIGS. 1KA and 1KB are respectively a plan view and a sectional structural view that illustrate the method for manufacturing an SGT-including pillar-shaped semiconductor device according to the first embodiment.
Figure 1K:
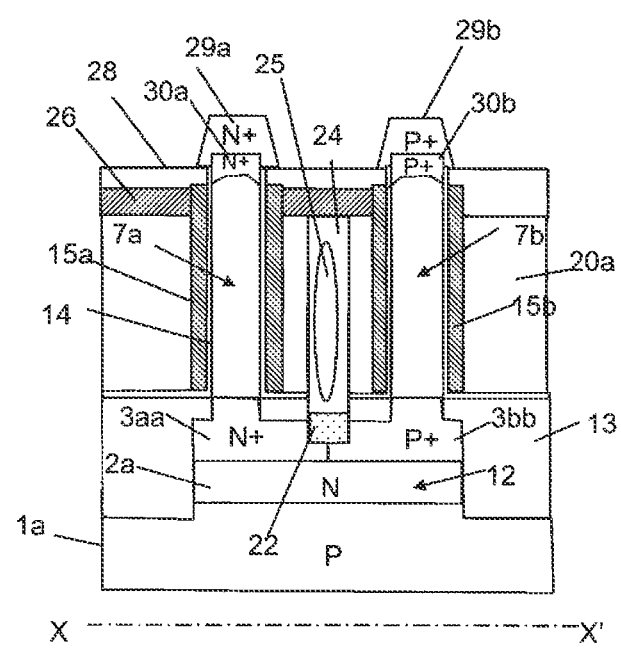

As illustrated in FIGS. 1KA and 1KB, a width L1 of the W layer 26 in the direction perpendicular to the line X-X' direction is smaller than a width L2 of the outermost peripheries of the TiN layers 15a and 15b serving as gates. In plan view, the shape of both ends of the Si pillars 7a and 7b in the first direction is typically rounded through the manufacturing process. Therefore, in this case, L2 is a longest line segment among point-to-point distances between intersections of outer peripheral lines of the TiN layers 15a and 15b and straight lines extending in the first direction in plan view. Subsequently, as illustrated in FIGS. 1KA and 1KB, a SiO$_2$ layer 28 is formed at outer peripheral portions around the side surfaces of the top portions of the Si pillars 7a and 7b. Subsequently, an N$^+$ layer 29a and a P$^+$ layer 29b are formed by, for example, selective epitaxial growth so as to cover the top portions of the Si pillars 7a and 7b, respectively. Subsequently, an N$^+$ layer 30a and a P$^+$ layer 30b are formed in the top portions of the Si pillars 7a and 7b, respectively, by thermal diffusion.

Figure 1L:
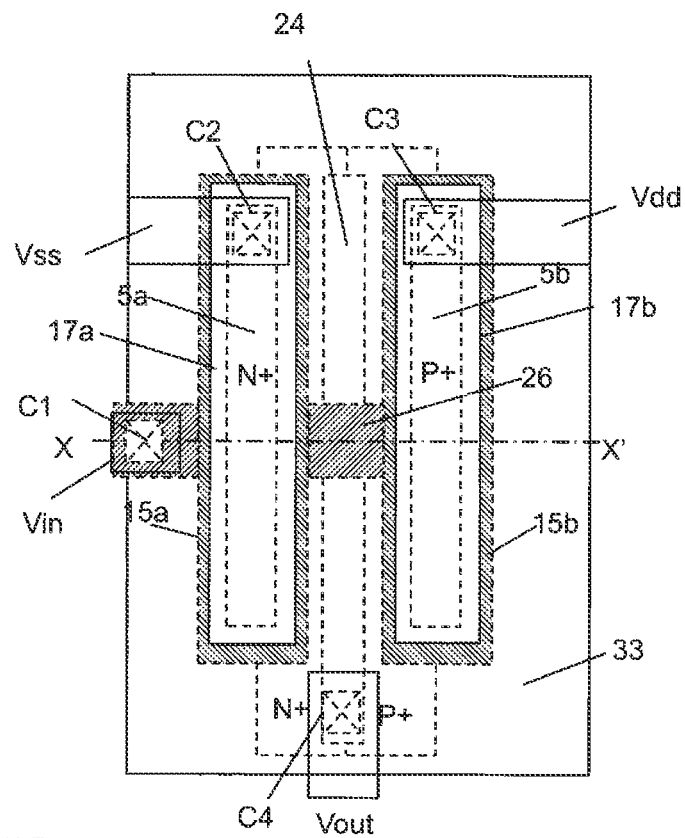
FIGS. 1LA and 1LB are respectively a plan view and a sectional structural view that illustrate the method for manufacturing an SGT-including pillar-shaped semiconductor device according to the first embodiment.
Figure 1L:
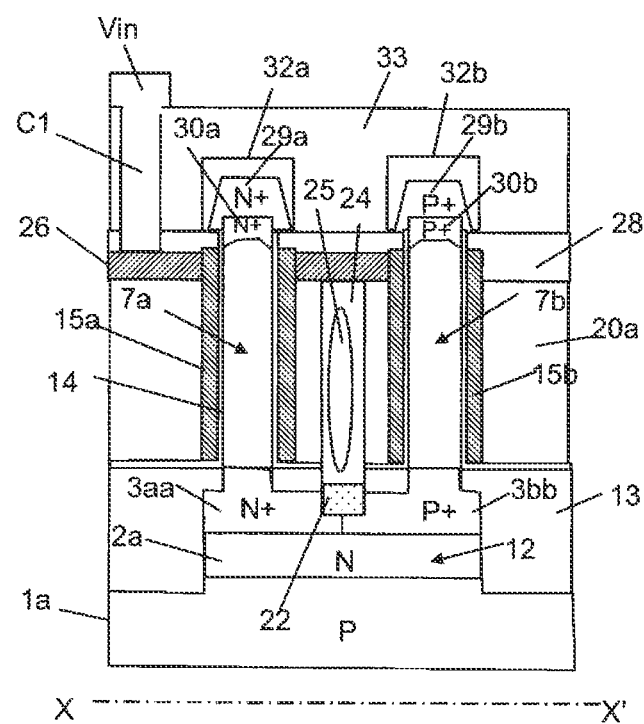

Next, as illustrated in FIGS. 1LA and 1LB, W layers 32a and 32b are formed on the N$^+$ layer 29a and the P$^+$ layer 29b, respectively. Subsequently, a SiO$_2$ layer 33 is formed so as to cover the entire surface. Subsequently, a contact hole C1 is formed in the SiO$_2$ layers 28 and 33 on the W layer 26. A contact hole C2 is formed in the SiO$_2$ layer 33 on the W layer 32a. A contact hole C3 is formed in the SiO$_2$ layer 33 on the W layer 32b. Subsequently, a contact hole C4 is formed in the SiO$_2$ layers 24, 28, and 33 on the W layer 22. Subsequently, an input wiring metal layer Vin connecting to the W layer 26 through the contact hole C1 is formed. Subsequently, a ground wiring metal layer Vss connecting to the W layer 32a through the contact hole C2 is formed. Subsequently, a power supply wiring metal layer Vdd connecting to the W layer 32b through the contact hole C3 is formed. Subsequently, an output wiring metal layer Vout connecting to the W layer 22 through the contact hole C4 is formed. Thus, an inverter circuit is formed on the P layer substrate 1a.

In the description of this embodiment, the shape of the Si pillars 7a and 7b is rectangular in plan view. However, the shape in plan view may be rounded at both ends in the direction perpendicular to the line X-X', circular, or elliptical.

In FIGS. 1FA and 1FB, the thickness of the TiN layer 15, which serves as a gate conductor layer, is larger than those of the SiN layers 17a and 17b. However, the thickness of the TiN layer 15 may be smaller than those of the SiN layers 17a and 17b, and a protective layer for the TiN layer 15 may be provided outside the TiN layer 15, the protective layer being composed of one or more conductor layers such as TaN layers or one or more insulating material layers such as SiN layers. In this case, in the process of forming the gate TiN layers 15a and 15b in FIGS. 1GA and 1GB, the protective layer is left so as to surround the side surfaces of the gate TiN layers 15a and 15b. When an insulating protective layer such as a SiN layer is formed, the insulating protective layer around the side surfaces of the top portions of the gate TiN layers 15a and 15b is removed before the formation of the W layer 26 in FIGS. 1JA and 1JB.

The N$^+$ layer 30a and the P$^+$ layer 30b formed in the top portions of the Si pillars 7a and 7b, respectively, may be, for example, an N$^+$ layer and a P$^+$ layer that are formed on the P layer 4 by epitaxial crystal growth after the formation of the P layer 4 in FIGS. 1BA and 1BB. In this case, the step, as illustrated in FIGS. 1KA and 1KB, of forming the N$^+$ layer 30a and the P$^+$ layer 30b by performing heat treatment to cause thermal diffusion of donor and acceptor impurities from the N$^+$ layer 29a and the P$^+$ layer 29b into the top portions of the Si pillars 7a and 7b, respectively, is not necessary. When the SiO$_2$ layer 28 is thick, if a high-temperature, long heat treatment is performed so that the lower ends of the N$^+$ layer 30a and the P$^+$ layer 30b become flush with the upper ends of the gate TiN layers 15a and 15b in the vertical direction, the gate TiN layers 15a and 15b and the HfO$_2$ layer 14 serving as a gate insulating layer may be damaged. To overcome this problem, the following procedure may be employed: a P$^+$ layer and an N$^+$ layer are formed on the P layer 4 after the formation of the P layer 4 and before the formation of the mask material layers 5a and 5b in FIGS. 1BA and 1BB, and from these P$^+$ layer and N$^+$ layer, the N$^+$ layer 30a and the P$^+$ layer 30b are formed in the top portions of the silicon pillars 7a and 7b. This can avoid thermal damage to the gate TiN layers 15a and 15b and the HfO$_2$ layer 14 serving as a gate insulating layer, as described above. This also eliminates the need for forming the N$^+$ layer 30a and the P$^+$ layer 30b in the top portions of the Si pillars 7a and 7b, respectively, by thermal diffusion at the stage of FIGS. 1KA and 1KB, thus facilitating the formation of impurity regions in the top portions of the Si pillars 7a and 7b. In this case, the N$^+$ layer 29a and the P$^+$ layer 29b may be, but need not be, formed. In this case, the N$^+$ layer 29a and the P$^+$ layer 29b may be replaced with conductor layers made of, for example, a metal or an alloy.

While the W layer 22 is formed directly on the N⁺ layer 3aa and the P⁺ layer 3bb, the W layer 22 may be formed after a conductor layer made of a metal or an alloy is formed on the upper surfaces of the N⁺ layer 3aa and the P⁺ layer 3bb between the Si pillars 7a and 7b. In addition, a conductor layer such as a TiN layer for reducing the contact resistance between the W layer 22 and the N⁺ layer 3aa and between the W layer 22 and the P⁺ layer 3bb may be formed below the W layer 22.

In the description of this embodiment, the Si pillar 7a forming an N-channel SGT and the Si pillar 7b forming a P-channel SGT have the same length in the direction perpendicular to the line X-X' in plan view. However, the length of the Si pillar 7a forming an N-channel SGT in the direction perpendicular to the line X-X' in plan view may be smaller than that of the Si pillar 7b forming a P-channel SGT. Alternatively, the Si pillar 7a forming an N-channel SGT and the Si pillar 7b forming a P-channel SGT may have different lengths in the line X-X' direction in plan view.

This embodiment provides the following features.
1. In this embodiment, as illustrated in FIGS. 1HA, 1HB, 1IB, and 1IB, after TiN layers 15a and 15b serving as gate electrodes are formed, a contact hole 21 is formed, and a bottom connecting wiring W layer 22 connecting to the N⁺ layer 3aa and the P⁺ layer 2bb is then formed at a bottom portion of the contact hole 21. Subsequently, a SiO₂ layer 24 effectively serving as a low-dielectric-constant layer and having a hole 25 is formed in the contact hole 21 on the W layer 22. Thereafter, as illustrated in FIGS. 1JA and 1JB, an input wiring W layer 26 connected to the gate electrode TiN layers 15a and 15b is formed on the SiO₂ layers 20a and 24a so as to be orthogonal to the bottom connecting wiring W layer 22 in plan view.

The above process offers the following features.
(1) Since the SiO₂ layer 24a, which serves as a low-dielectric-constant layer by virtue of the hole 25, and the bottom connecting W layer 22 are formed in the contact hole 21, the bottom connecting W layer 22 and the SiO₂ layer 24a serving as a low-dielectric-constant layer are formed in a self-aligned manner. This can provide a circuit with higher integration. As illustrated in FIGS. 1LA and 1LB, the SiO₂ layer 24 having the hole 25 and effectively serving as a low-dielectric-constant layer is present in a region where the bottom connecting W layer 22 and the input wiring W layer 26 overlap each other in plan view. This can reduce the capacitance between the bottom connecting W layer 22 and the input wiring W layer 26. This can provide an SGT-including circuit with higher performance.
(2) The bottom connecting W layer 26 connected to the input wiring metal layer Vin is connected only to upper portions of the gate electrodes 15a and 15b in the height direction. This configuration can significantly reduce the capacitance between the input wiring metal layer Vin and the output wiring metal layer Vout compared, for example, to a configuration in which the bottom connecting W layer 26a connected to the input wiring metal layer Vin is formed so as to have the same height as those of the gate electrodes 15a and 15b.
2. In this embodiment, as illustrated in FIGS. 1EA and 1EB, the P layer base 12 is shaped such that portions surrounding the Si pillars 7a and 7b protrude at outer portions of the N⁺ layer 3aa and the P⁺ layer 3bb in plan view. These protruding portions are formed in a self-aligned manner with the Si pillars 7a and 7b. This self-alignment enables the protruding P layer base 12 to be formed as a small area with high accuracy. This can provide an SGT-including circuit with higher integration.
3. In this embodiment, as illustrated in FIGS. 1FA, 1FB, 1GA, and 1GB, the TiN layers 15a and 15b serving as gate electrodes are formed in a self-aligned manner with respect to the Si pillars 7a and 7b, respectively. As illustrated in FIGS. 1JA and 1JB, the W layer 26 is formed in a band shape in the line X-X' direction so as to be connected to portions of the outer peripheries of the gate electrode TiN layers 15a and 15b. In plan view, the width of the W layer 26 in the direction perpendicular to the line X-X' is smaller than the length of outer peripheral long sides of the TiN layers 15a and 15b.

The above process offers the following features.
(1) The W layer 26 is formed using the mask material layer 27 as an etching mask separately from the formation of the gate line TiN layers 15a and 15b. This enables the width of the W layer 26a in the direction perpendicular to the line X-X' to be as small as possible while satisfying the condition that the W layer 26 connect to the gate line TiN layers 15a and 15b. This can further reduce the capacitance between the W layer 26 and the bottom connecting W layer 22. The gate TiN layers 15a and 15b are formed in a self-aligned manner with respect to the Si pillars 7a and 7b, respectively. This can provide an SGT-including circuit with even higher integration.

Second Embodiment

Figure 2A:
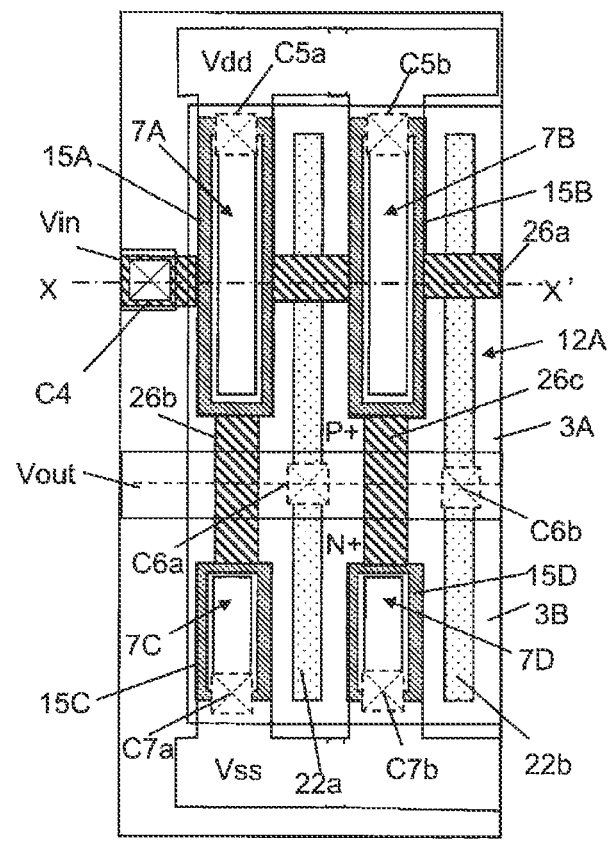
FIGS. 2A and 2B are respectively a plan view and a sectional structural view that illustrate a method for manufacturing an SGT-including pillar-shaped semiconductor device according to a second embodiment.
Figure 2B:
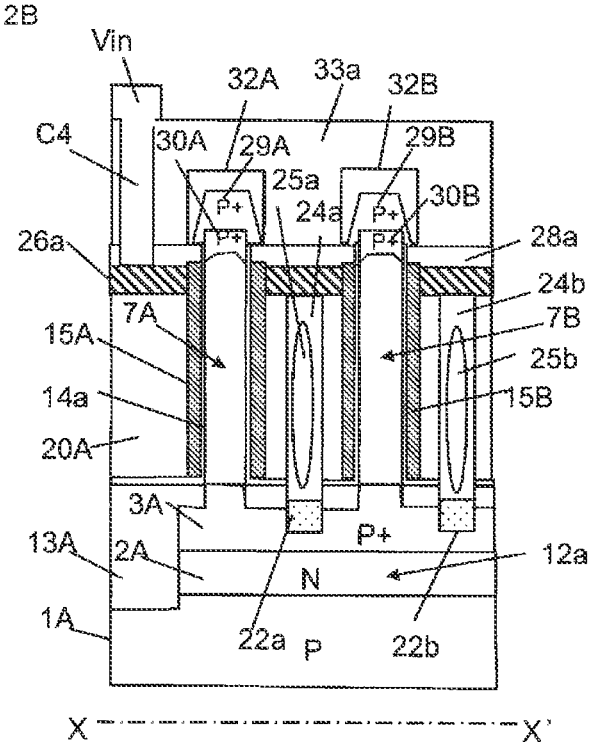

Hereinafter, a method for manufacturing an inverter circuit according to a second embodiment of the present invention will be described with reference to FIGS. 2A and 2B. FIG. 2A is a plan view, and FIG. 2B is a sectional structural view taken along line X-X' in FIG. 2A. In the first embodiment, the Si pillar 7a forming an N-channel SGT and the Si pillar 7b forming a P-channel SGT are formed side by side in the line X-X' direction with the bottom connecting wiring W layer 22 interposed therebetween. In this embodiment, two Si pillars, an N-channel SGT and a P-channel SGT, are disposed in the direction perpendicular to the line X-X' direction, and a W layer extending in the direction perpendicular to the line X-X' direction adjacently to the two Si pillars in plan view and corresponding to the bottom connecting wiring W layer 22 is formed. In this embodiment, a method for manufacturing an inverter circuit including two N-channel SGTs connected to each other in parallel and two P-channel SGTs connected to each other in parallel is described. This manufacturing method is basically the same as that in the first embodiment.

As illustrated in FIGS. 2A and 2B, Si pillars 7A, 7B, 7C, and 7D, which are rectangular in plan view, are formed on a P layer substrate 1A. Subsequently, a semiconductor base 12a constituted by an upper portion of the P layer substrate 1A, an N layer 2A, a P⁺ layer 3A, and an N⁺ layer 3B is formed on the P layer substrate 1A. In plan view, the P⁺ layer 3A underlies the Si pillars 7A and 7B, and the N⁺ layer 3B underlies the Si pillars 7C and 7D. Subsequently, a SiO₂ layer 13A is formed such that the upper surface thereof is flush with the upper surfaces of the P⁺ layer 3A and the N⁺ layer 3B. Subsequently, a gate insulating layer 14a is formed so as to surround the Si pillars 7A to 7D. Subsequently, gate TiN layers 15A, 15B, 15C, and 15D are formed so as to surround the gate insulating layers 14a on the side surfaces of the Si pillars 7A, 7B, 7C, and 7D, respectively. Subsequently, a SiO$_2$ layer 20A whose upper surface is located below the upper ends of the gate TiN layers 15A, 15B, 15C, and 15D is formed so as to surround the gate TiN layers 15A, 15B, 15C, and 15D. Subsequently, contact holes (not illustrated) extending in a band shape in a direction perpendicular to line X-X' are formed on the P$^+$ layer 3A and the N$^+$ layer 3B on both sides of the gate TiN layers 15B and 15D in plan view. Subsequently, bottom connecting wiring W layers 22a and 22b connected to the P$^+$ layer 3A and the N$^+$ layer 3B are formed at bottom portions of the contact holes. The bottom connecting wiring W layer 22a is formed between the gate TiN layers 15A and 15C and the gate TiN layers 15B and 15D in plan view.

Subsequently, as illustrated in FIGS. 2A and 2B, SiO$_2$ layers 24a and 24b which have holes 25a and 25b, respectively, and whose upper surfaces are located below the upper end surfaces of the gate TiN layers 15A to 15D are formed so as to fill the contact holes on the bottom connecting wiring W layers 22a and 22b, respectively. Subsequently, a wiring conductor W layer 26a connecting to the gate TiN layers 15A and 15B and extending in the line X-X' direction, a wiring conductor W layer 26b connecting to the gate TiN layers 15A and 15C and extending in the direction perpendicular to line X-X', and a wiring conductor W layer 26c connecting to the gate TiN layers 15B and 15D and extending in the direction perpendicular to line X-X' are formed. Subsequently, top portions of the Si pillars 7A to 7D are exposed, and a SiN layer 28a is formed at outer peripheral portions of the exposed top portions. Subsequently, for example, by selective epitaxial growth, P$^+$ layers 29A and 29B are formed so as to cover the top portions of the Si pillars 7A and 7B, respectively, and N$^+$ layers 29C (not illustrated) and 29D (not illustrated) are formed so as to cover the top portions of the Si pillars 7C and 7D, respectively. Subsequently, P$^+$ layers 30A and 30B and N$^+$ layers 30C (not illustrated) and 30D (not illustrated) are formed on the top portions of the Si pillars 7A, 7B, 7C, and 7D, respectively, by thermal diffusion. Subsequently, W layers 32A, 32B, 32C (not illustrated), and 32D (not illustrated) are formed on the P$^+$ layers 29A and 29B and the N$^+$ layers 29C and 29D, respectively. Subsequently, an input wiring metal layer Vin connecting to the W layer 26a through a contact hole C4 is formed. Subsequently, a power supply wiring metal layer Vdd connecting to the W layers 32A and 32B respectively through contact holes C5a and C5b is formed. Subsequently, an output wiring metal layer Vout connecting to the W layers 22a and 22b respectively through contact holes C6a and C6b is formed. Subsequently, a ground wiring metal layer Vss connecting to the W layers 32C and 32D respectively through contact holes C7a and C7b is formed. Thus, an inverter circuit including two P-channel SGTs connected to each other in parallel and two N-channel SGTs connected to each other in parallel on the P layer substrate 1A is formed.

As described above, an inverter circuit including P-channel SGTs connected to each other in parallel and N-channel SGTs connected to each other in parallel can achieve a higher drive current due to the increase in the number of P-channel SGTs and N-channel SGTs connected in parallel.

The gate TiN layers 15A to 15D are electrically connected through the W layers 26a to 26c. Due to this configuration, the W layer 26a connecting to the input wiring metal layer Vin may be provided anywhere in the direction perpendicular to the line X-X' direction in plan view as long as the W layer 26a is connected to the gate TiN layers 15A and 15B or the gate TiN layers 15C and 15D.

In the description of this embodiment, the P$^+$ layer 3A and the N$^+$ layer 3B are continuously formed in plan view in the semiconductor base 12a. Alternatively, the semiconductor base 12a may be formed as two separate semiconductor bases, a first semiconductor base including the P$^+$ layer 3A and a second semiconductor base including the N$^+$ layer 3B. In this case, the W layers 22a and 22b are formed so as to be connected to the P$^+$ layer 3A and the N$^+$ layer 3B and to be continuous over the upper surface of the SiO$_2$ layer 13A disposed between the two semiconductor bases.

When the line resistance of the W layer 26a needs to be small for the sake of circuit performance, the SiO$_2$ layer 33a on the W layer 26a may be provided with a plurality of contact holes, and a wiring metal layer connected to the input wiring metal layer Vin through the contact holes may be formed.

This embodiment provides the following features.

1. As in the first embodiment, the W layers 22a and 22b formed on the semiconductor base, and the W layer 26a orthogonal to and overlapping the W layers 22a and 22b in plan view are formed so as to be separate from each other in the vertical direction. This can reduce the capacitance between the input wiring metal layer Vin and the output wiring metal layer Vout. Furthermore, as in the first embodiment, the SiO$_2$ layers 24a and 24b having the holes 25a and 25b, respectively, and effectively serving as low-dielectric material layers are formed in a self-aligned manner on the W layers 22a and 22b, respectively. This can further reduce the capacitance between the input wiring metal layer Vin and the output wiring metal layer Vout.

2. In this embodiment, the Si pillar 7A, which is a P-channel SGT, and the Si pillar 7C, which is an N-channel SGT, are aligned in the direction perpendicular to the line X-X' direction to form a first inverter circuit. Likewise, the Si pillar 7B, which is a P-channel SGT, and the Si pillar 7D, which is an N-channel SGT, are aligned in the direction perpendicular to the line X-X' direction to form a second inverter circuit. For example, when an inverter-ring oscillator circuit is formed using these two inverter circuits, the coupling capacitance between input electrodes of the first inverter circuit (in this case, the gate TiN layers 15A and 15C) and input electrodes of the second inverter circuit (in this case, the gate TiN layers 15B and 15D) is a problem. However, by disposing the SiO$_2$ layer 24a effectively serving as a low-dielectric material layer between the gate TiN layers 15A and 15C and the gate TiN layers 15B and 15D as in this embodiment, the coupling capacitance can be reduced.

Third Embodiment

Figure 3A:
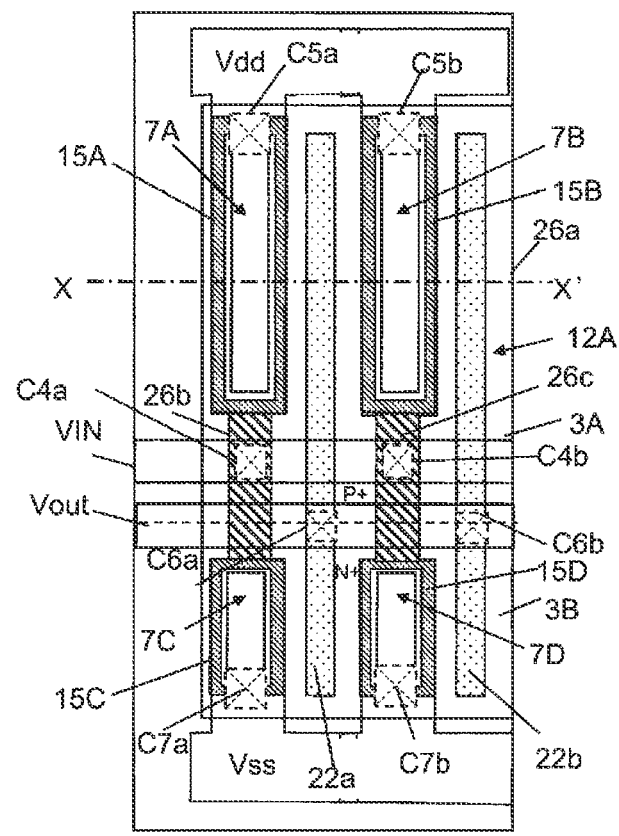
FIGS. 3A and 3B are respectively a plan view and a sectional structural view that illustrate a method for manufacturing an SGT-including pillar-shaped semiconductor device according to a third embodiment.
Figure 3B:
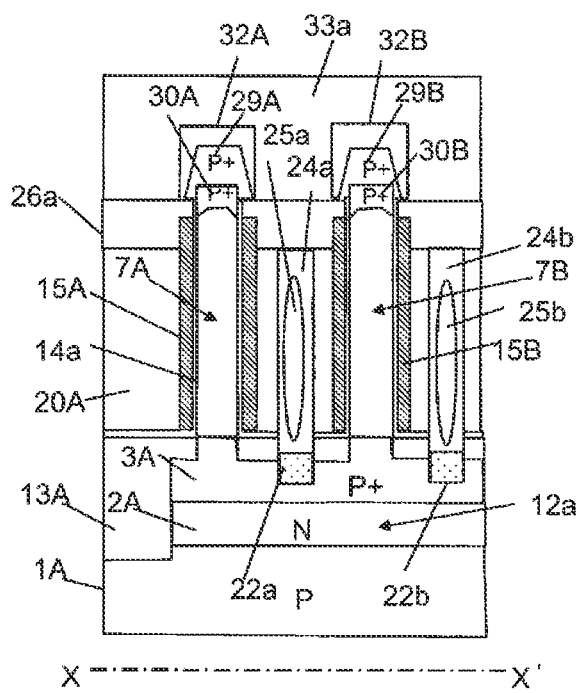
Figure 4:
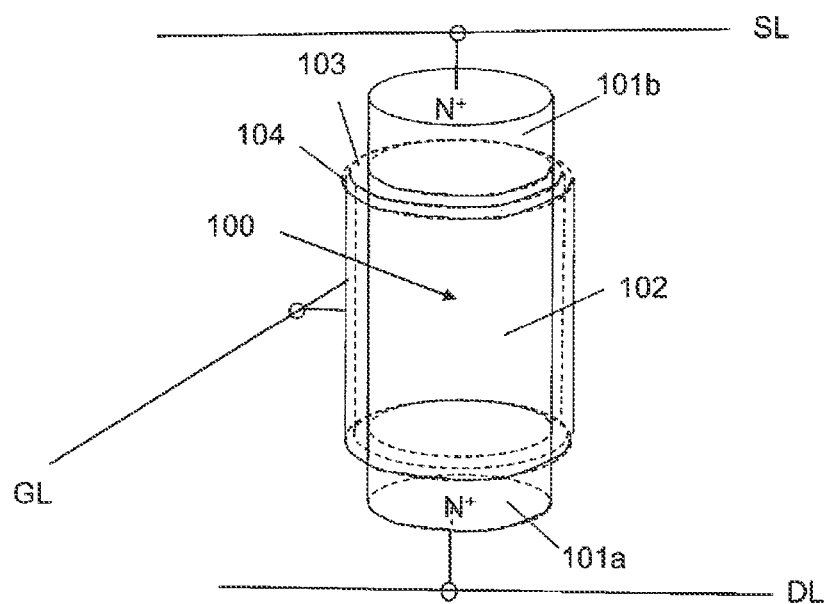
FIG. 4 is a three-dimensional structural view that illustrates a conventional example.

Hereinafter, a method for manufacturing an inverter circuit according to a third embodiment of the present invention will be described with reference to FIGS. 3A and 3B. FIG. 3A is a plan view, and FIG. 3B is a sectional structural view taken along line X-X' in FIG. 3A.

In the second embodiment, as illustrated in FIGS. 2A and 2B, the input wiring metal layer Vin connects through the contact hole C4 to the W layer 26a connected to long sides of the gate TiN layers 15A and 15B perpendicular to line X-X' in plan view. By contrast in this embodiment, as illustrated in FIGS. 3A and 3B, contact holes C4a and C4b are respectively formed on a W layer 26b which connects gate TiN layers 15A and 15C aligning in the direction perpendicular to line X-X' in plan view and a W layer 26c which connects gate TiN layers 15B and 15D. An input wiring metal layer VIN is connected to the W layers 26b and 26c respectively through the contact holes C4a and C4b. Thus, an inverter circuit including two P-channel SGTs connected to each other in parallel and two N-channel SGTs connected to each other in parallel on a P layer substrate 1A is formed. Except for the above, this inverter circuit is formed by the same process as illustrated in FIGS. 2A and 2B.

This embodiment provides the following features.

In the second embodiment, at portions where the W layer 26a overlaps the W layers 22a and 22b in plan view, the SiO$_2$ layers 24a and 24b having the holes 25a and 25b, respectively, are present between the W layer 26a and the W layers 22a and 22b. By contrast in the third embodiment, the input wiring metal layer VIN overlaps the W layers 22a and 22b in plan view. At these overlapping portions, the SiO$_2$ layers 24a and 24b having the holes 25a and 25b, respectively, and the SiO$_2$ layers 28a and 33a are present between the input wiring metal layer VIN and the W layers 22a and 22b. Due to this configuration, the capacitance between the input wiring metal layer VIN and the output wiring metal layer Vout can be reduced in the third embodiment.

OTHER EMBODIMENTS

For example, the first embodiment has the feature that the W layer 22 connecting to the N$^+$ layer 3aa serving as a source or a drain at the bottom of one SGT formed at the Si pillar 7a and the W layer 26 connecting to the gate TiN layer 15a overlap each other in plan view with the SiO$_2$ layer 24, which is an effective low-dielectric-constant layer, interposed therebetween. Similarly, the third embodiment has the feature that the W layers 22a and 22b connecting to the P$^+$ layer 3A and the W layer 26a connecting to the gate TiN layers 15A and 15B overlap each other in plan view with the SiO$_2$ layers 24a and 24b, which are effective low-dielectric-constant layers, and the holes 25a and 25b interposed therebetween. The present invention is also applicable to logic circuits including other SGTs, selector elements such as a dynamic random access memory (DRAM), a phase change memory (PCM), a magnetic random access memory (MRAM), and a resistive random access memory (RRAM), and other circuits such as peripheral circuits as long as it has any of the above features. The same applies to the second embodiment.

While the Si pillars 7a and 7b are formed in the first embodiment, semiconductor pillars made of other semiconductor materials may also be used. The same applies to other embodiments according to the present invention.

The N$^+$ layer 3aa and the P$^+$ layer 3bb in the first embodiment may each be formed of Si containing a donor impurity or an acceptor impurity or any other semiconductor material. The N$^+$ layers 3aa and 29a and the P$^+$ layers 3bb and 29b may be formed of different semiconductor materials. The same applies to other embodiments according to the present invention.

In the description of the first embodiment, it has been mentioned that the N$^+$ layer 30a and the P$^+$ layer 30b formed in the top portions of the Si pillars 7a and 7b, respectively, may be, for example, an N$^+$ layer and a P$^+$ layer that are formed on the P layer 4 by epitaxial crystal growth after the formation of the P layer 4 in FIGS. 1BA and 1BB. These N$^+$ layer and P$^+$ layer may be formed by another method different from epitaxial crystal growth. The same applies to other embodiments according to the present invention.

Since the first embodiment has been described in the context of an inverter circuit, the P$^+$ layers 29b and 30b and the N$^+$ layers 29a and 30a serve as sources, and the P$^+$ layer 3bb and the N$^+$ layer 3aa operate as drains, but depending on the circuit to be manufactured, impurity layers at upper and lower portions of SGTs can each serve as a source or a drain. The same applies to other embodiments according to the present invention.

The mask material layers 5a, 5b, 11, and 27 used in the first embodiment may be replaced with another material layer having a single-layer structure or a multilayer structure and containing an organic material or an inorganic material as long as the material is suitable for the object of the present invention. The SiO$_2$ layer 9a and the SiN layers 10a and 10b used as etching masks may also be replaced with another material layer having a single-layer structure or a multilayer structure and containing an organic material or an inorganic material as long as the material is suitable for the object of the present invention. The same applies to other embodiments according to the present invention.

The W layer 22 in the first embodiment may be made of not only a metal but also a conductive material such as an alloy, an alloy containing an acceptor or donor impurity in a large amount, or a semiconductor and may have a single-layer structure or a multilayer structure. The same applies to other embodiments according to the present invention.

In the first embodiment, the TiN layers 15a and 15b are used as gate conductor layers. The TiN layers 15a and 15b may each be any material layer having a single-layer structure or a multilayer structure as long as the material is suitable for the object of the present invention. The TiN layers 15a and 15b may each be formed of a conductor layer having at least a desired work function, such as a metal layer having a single-layer structure or a multilayer structure. Another conductive layer such as a W layer may be formed outside the TiN layers. Instead of the W layer, a metal layer having a single-layer structure or a multilayer structure may be used.

The W layer 26 connecting to the TiN layers 15a and 15b in the first embodiment may be formed of a laminate with another conductor layer or formed of another conductor layer. The same applies to other embodiments according to the present invention.

Furthermore, while the HfO$_2$ layer 14 is used as a gate insulating layer, other material layers each having a single-layer structure or a multilayer structure may be used. The same applies to other embodiments according to the present invention.

In FIGS. 1HA and 1HB and FIGS. 1IA and 1IB of the first embodiment, the SiO$_2$ layer 24 having the hole 25 is formed. However, an upper portion of the contact hole 21 may be covered with a SiN layer by, for example, chemical vapor deposition (CVD) to form the hole 25. Alternatively, an insulating layer formed of an inorganic or organic layer having the hole 25 may be formed by another method.

In the first embodiment, the shapes of the Si pillars 7a and 7b in plan view are rectangular. The shapes of these Si pillars in plan view may not only be rectangular but also be circular, elliptical, or U-shaped. These shapes may coexist on the same P layer substrate 1a. The same applies to other embodiments according to the present invention.

While the first embodiment has been described in the context of an inverter circuit including one N-channel SGT and one P-channel SGT, a plurality of N-channel SGTs and P-channel SGTs may be connected in parallel in order to achieve a high drive current or low effective SGT series resistance. The same applies to other embodiments according to the present invention.

This embodiment has been described in the context of an inverter circuit. In addition to this, the present invention is also applicable to an SGT-including circuit in which a conductor layer (the W layer 22 in the first embodiment) that is connected to an impurity region (the N$^+$ layer 3aa or the P$^+$ layer 3bb in the first embodiment) formed at a bottom portion of an SGT and serving as a source or a drain and that extends in a band shape in the first direction and a wiring conductor layer (the W layer 26 in the first embodiment) that connects to a gate conductor layer (the TiN layer 15a or the TiN layer 15b in the first embodiment) and that is perpendicular to the first direction are formed so as to overlap each other in plan view.

While one SGT is formed at one semiconductor pillar in the embodiments according to the present invention, the present invention is also applicable to the formation of circuits in which two or more SGTs are formed at one semiconductor pillar.

While the SGTs are formed on the P layer substrate 1 in the first embodiment, the P layer substrate 1 may be replaced with a silicon-on-insulator (SOI) substrate. Alternatively, any other material substrate may be used as long as it serves as a substrate. The same applies to other embodiments according to the present invention.

While the first embodiment has been described in the context of SGTs in which sources and drains are formed on the upper and lower sides of the Si pillars 7a and 7b using the N$^+$ layers 3aa, 29a, and 30a and the P$^+$ layers 3bb, 29b, and 30b having conductivity of the same polarity, the present invention is also applicable to tunneling SGTs including sources and drains having different polarities. The same applies to other embodiments according to the present invention.

Various embodiments and modifications of the present invention can be made without departing from the broad spirit and scope of the present invention. The foregoing embodiments are illustrative of examples of the present invention and are not intended to limit the scope of the present invention. The foregoing examples and modifications can be combined in any manner. Furthermore, the foregoing embodiments fall within the scope of the technical idea of the present invention even if some elements are excluded from those embodiments as needed.

The method for manufacturing a pillar-shaped semiconductor device according to the present invention provides a pillar-shaped semiconductor device with high density and high performance.

What is claimed is:

1. A method for manufacturing a pillar-shaped semiconductor device that includes
   a first semiconductor pillar standing in a direction perpendicular to a substrate,
   a first impurity region disposed at a bottom portion of the first semiconductor pillar,
   a second impurity region disposed at a top portion of the first semiconductor pillar, one of the first impurity region and the second impurity region serving as a source, the other serving as a drain, the first semiconductor pillar between the first impurity region and the second impurity region serving as a channel,
   a first gate insulating layer surrounding the first semiconductor pillar disposed between the first impurity region and the second impurity region, and
   a first gate conductor layer surrounding the first gate insulating layer, the method comprising:
   a step of forming the first impurity region such that the first impurity region extends in a band shape in a first direction in plan view;
   a step of forming the first semiconductor pillar that overlaps the first impurity region in plan view;
   a step of forming a semiconductor base that includes the first semiconductor pillar and the first impurity region and extends in a band shape in the first direction in plan view such that the semiconductor base connects to the bottom portion of the first semiconductor pillar;
   a step of forming the first gate insulating layer and the first gate conductor layer such that the first semiconductor pillar is surrounded;
   a step of forming a first insulating layer at an outer peripheral portion of the first gate conductor layer;
   a step of forming, in the first insulating layer, a contact hole that overlaps the first impurity region disposed in the semiconductor base in plan view, has a bottom portion in contact with the first impurity region, and extends in a band shape in the first direction;
   a step of forming, at the bottom portion of the contact hole, a first conductor layer that is in contact with the first impurity region and extends in a band shape in the first direction;
   a step of forming, in the contact hole on the first conductor layer, a second insulating layer that has a hole or is made of a low-dielectric-constant material;
   a step of lowering an upper surface of the second insulating layer below an upper end of the first gate conductor layer; and
   a step of forming a second conductor layer that is in contact with the first gate conductor layer and extends in a band shape in a second direction perpendicular to the first direction in plan view.

2. The method for manufacturing a pillar-shaped semiconductor device according to claim 1, further comprising:
   a step of forming the first semiconductor pillar using a first mask material layer as an etching mask;
   a step of forming a third insulating layer that surrounds the first semiconductor pillar and has an upper surface located at a bottom portion of the first mask material layer or the top portion of the first semiconductor pillar in the direction perpendicular to the substrate;
   a step of forming a second mask material layer that is disposed on the third insulating layer and surrounds the exposed first mask material layer and the top portion of the first semiconductor pillar with an equal width in plan view;
   a step of forming, on the third insulating layer, a third mask material layer that partially overlaps the second mask material layer and extends in a band shape in the first direction in plan view; and
   a step of forming the semiconductor base by etching the third insulating layer and the first impurity layer using the first mask material layer, the second mask material layer, and the third mask material layer as masks.

3. The method for manufacturing a pillar-shaped semiconductor device according to claim 1,
   wherein, in the first direction in plan view, the second conductor layer is formed so as to have a width that is smaller than a longest line segment among point-to-point distances between intersections of an outer peripheral line of the first gate conductor layer and straight lines extending in the first direction.

4. The method for manufacturing a pillar-shaped semiconductor device according to claim 1,
wherein, in the direction perpendicular to the substrate, the first conductor layer is formed so as to have an upper end that is located below a lower end of the first gate conductor layer.

5. The method for manufacturing a pillar-shaped semiconductor device according to claim 1,
wherein, in the direction perpendicular to the substrate, the hole is formed so as to have an upper end that is located below an upper end of the first gate conductor layer.

6. The method for manufacturing a pillar-shaped semiconductor device according to claim 1, further comprising:
a step of forming a second semiconductor pillar on the semiconductor base on an opposite side of the first conductor layer from the first semiconductor pillar in the second direction in plan view;
a step of forming a second gate insulating layer such that the second gate insulating layer surrounds the second semiconductor pillar;
a step of forming a second gate conductor layer such that the second gate conductor layer surrounds the second gate insulating layer; and
a step of forming the second conductor layer that extends in the second direction in plan view and is connected to an upper end portion of the second gate conductor layer.

7. The method for manufacturing a pillar-shaped semiconductor device according to claim 1, further comprising:
a step of forming a third impurity region that is disposed in the semiconductor base and is adjacent to the first impurity region in the first direction in plan view;
a step of forming a third semiconductor pillar on the third impurity region;
a step of forming a third gate insulating layer such that the third gate insulating layer surrounds the third semiconductor pillar;
a step of forming a third gate conductor layer such that the third gate conductor layer surrounds the third gate insulating layer;
a step of forming the second conductor layer such that the second conductor layer extends in the first direction and is in contact with the third impurity region in plan view; and
a step of forming a third conductor layer that extends in the second direction in plan view and connects to upper portions of the first gate conductor layer and the third gate conductor layer.

8. The method for manufacturing a pillar-shaped semiconductor device according to claim 1, further comprising:
a step of forming, on the substrate, a first impurity layer on which the first impurity region is based;
a step of forming, on the first impurity layer, a first semiconductor layer on which the first semiconductor pillar is partially based; and
a step of forming, on the first semiconductor layer, a second impurity layer on which the first semiconductor pillar is partially based and which forms at least a part of the second impurity region.

9. The method for manufacturing a pillar-shaped semiconductor device according to claim 8, further comprising:
a step of forming, on the second impurity region, a third impurity layer having the same polarity as that of the second impurity region or a conductive layer made of an alloy or a metal.

10. A pillar-shaped semiconductor device comprising:
a first semiconductor pillar standing perpendicularly with respect to a substrate;
a first impurity region connecting to a bottom portion of the first semiconductor pillar and extending in a band shape in a first direction;
a second impurity region disposed at a top portion of the first semiconductor pillar;
a first gate insulating layer surrounding the first semiconductor pillar disposed between the first impurity region and the second impurity region;
a first gate conductor layer surrounding the first gate insulating layer;
a semiconductor base connecting to the bottom portion of the first semiconductor pillar, including the first impurity region, and extending in a band shape in the first direction in plan view;
a first insulating layer disposed at an outer peripheral portion of the first gate conductor layer;
a first material layer disposed in the first insulating layer, overlapping the first impurity region disposed in the semiconductor base in plan view, having a bottom portion in contact with the first impurity region, and extending in a band shape in the first direction and also extending in a vertical direction;
a first conductor layer extending in a band shape in the first direction so as to be in contact with the first impurity region at a bottom portion of the first material layer;
a second insulating layer in which the first material layer on the first conductor layer has a hole whose upper surface is located below an upper end of the first gate conductor layer or which is made of a low-dielectric-constant material; and
a second conductor layer connecting to the first gate conductor layer and extending in a band shape in a second direction perpendicular to the first direction in plan view,
wherein the first conductor layer and the second conductor layer overlap each other at an intersection in plan view.

11. The pillar-shaped semiconductor device according to claim 10,
wherein the second conductor layer connects to the first gate conductor layer in a contact manner, and
in the first direction in plan view, the second conductor layer is formed so as to have a width that is smaller than a longest line segment among point-to-point distances between intersections of an outer peripheral line of the first gate conductor layer and straight lines extending in the first direction.

12. The pillar-shaped semiconductor device according to claim 10,
wherein, in a direction perpendicular to the substrate, an upper end of the first conductor layer is located below a lower end of the first gate conductor layer.

13. The pillar-shaped semiconductor device according to claim 10, comprising:
a second semiconductor pillar disposed on the semiconductor base on an opposite side of the first conductor layer from the first semiconductor pillar in the second direction in plan view;
a second gate insulating layer surrounding the second semiconductor pillar;
a second gate conductor layer surrounding the second gate insulating layer; and the second conductor layer extending in the second direction in plan view and connected to an upper end portion of the second gate conductor layer.

14. The pillar-shaped semiconductor device according to claim 10, comprising:
- a third impurity region disposed in the semiconductor base and adjacent to the first impurity region in the first direction in plan view;
- a third semiconductor pillar disposed on the third impurity region;
- a third gate insulating layer surrounding the third semiconductor pillar; and
- a third gate conductor layer surrounding the third gate insulating layer,
- wherein the first conductor layer extends in the first direction and is adjacent to the third semiconductor pillar in plan view,
- the pillar-shaped semiconductor device further comprising a third conductor layer extending in the second direction in plan view and connecting to upper portions of the first gate conductor layer and the third gate conductor layer.

15. The pillar-shaped semiconductor device according to claim 14, further comprising:
- a second insulating layer on the third conductor layer;
- a first contact hole disposed in the second insulating layer on the third conductor layer; and
- the second conductor layer disposed on the second insulating layer and connecting to the third conductor layer through the first contact hole.

16. The pillar-shaped semiconductor device according to claim 10, further comprising, on the second impurity region, a third impurity layer having the same polarity as that of the second impurity region or a conductive layer made of an alloy or a metal.

* * * * *